United States Patent
Mari Curbelo et al.

(10) Patent No.: US 12,225,657 B2
(45) Date of Patent: Feb. 11, 2025

(54) POWER SYSTEM AND METHOD FOR CONTROLLING POWER MODULES

(71) Applicant: Transportation IP Holdings, LLC, Norwalk, CT (US)

(72) Inventors: Alvaro Jorge Mari Curbelo, Oberschleissheim (DE); Lucia Fantauzzo, Munich (DE); Fabio Carastro, Munich (DE); Tiziana Bertoncelli, Munich (DE); Thomas Alois Zoels, Hebertshausen (DE)

(73) Assignee: Transportation IP Holdings, LLC, Norwalk, CT (US)

( * ) Notice: Subject to any disclaimer, the term of this patent is extended or adjusted under 35 U.S.C. 154(b) by 99 days.

(21) Appl. No.: 17/718,761

(22) Filed: Apr. 12, 2022

(65) Prior Publication Data
US 2022/0240376 A1 Jul. 28, 2022

Related U.S. Application Data

(63) Continuation-in-part of application No. 15/397,485, filed on Jan. 3, 2017, now abandoned.

(51) Int. Cl.
*H05K 1/00* (2006.01)
*H02M 7/537* (2006.01)
(Continued)

(52) U.S. Cl.
CPC .............. *H05K 1/00* (2013.01); *H02M 7/537* (2013.01); *H05K 1/0213* (2013.01);
(Continued)

(58) Field of Classification Search
CPC ...... H05K 1/0254; H05K 1/00; H05K 1/0213; H05K 1/0296
See application file for complete search history.

(56) References Cited

U.S. PATENT DOCUMENTS 6,160,718 A * 12/2000 Vakilian ................ H01L 25/105
361/767
6,222,739 B1 * 4/2001 Bhakta .................... G06F 1/184
361/791
(Continued)

OTHER PUBLICATIONS

Wikipedia article "Electrical Resistivity and Conductivity" available at https://en.wikipedia.org/wiki/Electrical_resistivity_and_conductivity (Year: 2017).*

*Primary Examiner* — Adi Amrany
(74) *Attorney, Agent, or Firm* — K&L Gates LLP

(57) ABSTRACT

Systems and methods described herein relate to an adapter driver board for parallel operation of power modules. The systems and methods receive an electrical signal at an input interface of a high voltage adapter board. The systems and methods may deliver the electrical signals to first and second switches along corresponding first and second conductive traces. The first conductive trace extends along the high voltage adapter board and is conductively coupled to the input interface and the first switch. The second conductive trace extends along the high voltage adapter board and is conductively coupled to the input interface and the second switch. The first and second conductive traces may have an inductance or other property that is substantially the same as each other.

14 Claims, 9 Drawing Sheets

(51) Int. Cl.
*H05K 1/02* (2006.01)
*H05K 1/18* (2006.01)
*H05K 3/30* (2006.01)

(52) U.S. Cl.
CPC ......... *H05K 1/0254* (2013.01); *H05K 1/0296* (2013.01); *H05K 1/189* (2013.01); *H05K 3/301* (2013.01); *H05K 2201/073* (2013.01); *H05K 2201/09218* (2013.01)

(56) References Cited

U.S. PATENT DOCUMENTS

| | | | |
|---|---|---|---|
| 10,601,335 B1* | 3/2020 | Ruiz | H05K 1/183 |
| 2007/0165376 A1* | 7/2007 | Bones | H01L 25/162 |
| | | | 257/E25.031 |
| 2011/0181128 A1* | 7/2011 | Perreault | H02M 7/797 |
| | | | 307/151 |
| 2011/0199800 A1* | 8/2011 | Yahata | B60L 3/003 |
| | | | 363/131 |
| 2012/0300522 A1* | 11/2012 | Tokuyama | H01L 23/49575 |
| | | | 257/691 |
| 2015/0270787 A1* | 9/2015 | Fujisaki | H02M 3/158 |
| | | | 363/41 |
| 2016/0165715 A1* | 6/2016 | Kahrimanovic | H05K 3/3426 |
| | | | 361/709 |
| 2016/0216318 A1* | 7/2016 | Zhang | G01R 31/2818 |
| 2016/0365788 A1* | 12/2016 | Singh | H02P 29/02 |
| 2017/0033593 A1* | 2/2017 | Kamizuma | H02M 5/45 |
| 2017/0059632 A1* | 3/2017 | Parkman | G01R 19/32 |
| 2017/0098598 A1* | 4/2017 | Otremba | H01L 23/3107 |
| 2018/0062539 A1* | 3/2018 | Singh | H05K 1/165 |
| 2018/0077812 A1* | 3/2018 | Gudgel | H05K 7/1432 |

* cited by examiner

POWER SYSTEM AND METHOD FOR CONTROLLING POWER MODULES

CROSS-REFERENCE TO RELATED APPLICATIONS

This application is a Continuation-In-Part of U.S. Non-Provisional application Ser. No. 15/397,485, filed Jan. 3, 2017, the entire disclosure of which is incorporated herein by reference.

BACKGROUND

Technical Field

Embodiments of the subject matter described herein relate to an adapter driver board for parallel operation of power modules.

Discussion of Art

Some vehicle systems (e.g., locomotives), may employ electric traction motors for driving wheels of the vehicles. In some of these vehicles, the motors are alternating current (AC) motors whose speed and power are controlled by varying the frequency and the voltage of AC electric power supplied to the field windings of the motors. The high electric power may be supplied as DC power that is converted to AC power of controlled frequency and voltage amplitude by a circuit such as an inverter circuit. Conventional inverter circuits include a plurality of semiconductor switches (e.g., insulated gate bipolar transistors, Power MOSFETS, and/or the like) that are switched on and off by driver circuitry in an alternating fashion to produce an output AC waveform.

The high electric power requires high currents provided by the inverter circuits. To achieve this, conventional inverter circuits may need to connect multiple semiconductor switches in parallel by coupling the plurality of semiconductor switches using a plurality of flex cables (e.g., ribbon cables). However, due to differences in impedances between each of the semiconductor switches and driver circuitry, the activation/deactivation of each of the semiconductor switches are phase shifted, which in turn may create a current imbalance in the power terminal of the conventional inverter circuit. Additionally, the conventional inverter circuit using flex cabling is relatively fragile and adds expense. It may be desirable to have an electronic device or circuit, such as an inverter, which differs from those devices or circuits that are currently available.

BRIEF DESCRIPTION

In accordance with one example or aspect, a system (e.g., a power system) is provided that includes a high voltage adapter board coupled to a first module and a second module. The first module is conductively coupled to a first terminal of the high voltage adapter board. A first conductive trace extends along the high voltage adapter board and is conductively coupled to the first terminal. The second module is conductively coupled to a second terminal of the high voltage adapter board and a second conductive trace extends along the high voltage adapter board and is conductively coupled to the second terminal. The first conductive trace and the second conductive trace are each conductively coupled to an input interface. The system includes a first switch of the first module and a second switch of the second module. The first switch is conductively coupled to the first terminal and the second switch is conductively coupled to the second terminal. The first and second conductive traces may have an inductance that is substantially the same such that the first and second conductive traces may synchronously activate the first and second switches.

In accordance with one example or aspect, a method is provided that includes receiving an electrical signal at an input interface of a high voltage adapter board. The method includes delivering the electrical signals to first and second switches along corresponding first and second conductive traces. The first conductive trace extends along the high voltage adapter board and is conductively coupled to the input interface and the first switch. The second conductive trace extends along the high voltage adapter board and is conductively coupled to the input interface and the second switch. The first and second conductive traces may each have an inductance substantially the same. The method further includes synchronously activating the first and second switches based on the electrical signal.

In accordance with one example or aspect, a system (e.g., a power system) is provided. The system includes a high voltage adapter board connected to a plurality of modules. Each module includes a first switch conductively coupled to an input interface through conductive traces along the high voltage board. Each of the conductive traces may have an inductance that is substantially the same such that the conductive traces may synchronously activate the corresponding first switches based on an electrical signal. The system includes a driver circuit positioned remotely with respect to the high voltage adapter board. The driver circuit is conductively coupled to the input interface and communicate the electrical signal to the high voltage adapter board.

DETAILED DESCRIPTION

Figure 1A:
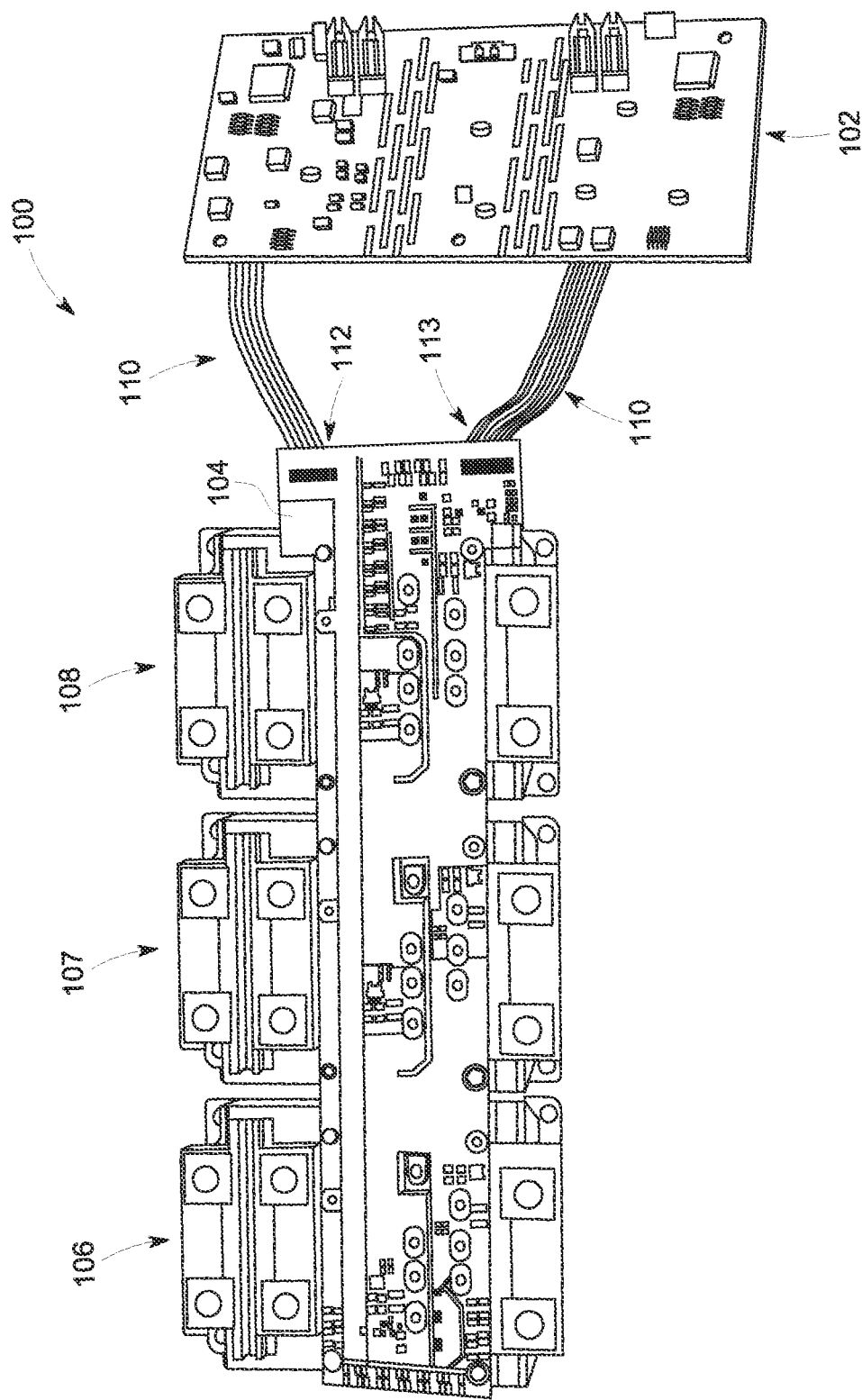
FIG. 1A illustrates a peripheral view of an embodiment of a power system.

Embodiments of the subject matter described herein relate to an adapter driver board for operation of one or more power modules. Operation may be in parallel. Some embodiments of the subject matter described herein may relate to parallel operation of power modules and to the use of an adapter board for parallel operation of a plurality of power modules that each include semiconductor switches.

In one embodiment, each of the power modules may be of a dual type having two semiconductor switches (e.g., an upper switch and a lower switch) connected in series. Suitable semiconductor switches may have a fast-switching transients as wide band gap semiconductors, such as SiC, GaN, and/or the like. The semiconductor switches may include insulated gate bipolar transistors (IGBT), MOSFETS, diodes, and/or the like. The adapter board may be conductively coupled to a remotely connected driving circuit or a dual gate driver. For example, the driving circuit may serve a plurality of parallel connected power modules. The remotely connected driving circuit is physically separate from the adapter board, and may instruct the semiconductor switches to activate and/or deactivate. Additionally or alternatively, the driving circuit may be mounted on top of one or more power modules of the circuit board. Optionally, the power modules may allow scalable converter designs in voltage and/or current. For example, the power modules may be enclosed within a housing enabling the power modules to be positioned in a close physical proximity to each other and connecting them accordingly to increase current and/or voltage. Additionally or alternatively, additional adapter boards may be electrically and/or conductively coupled to each other and to the power modules to increase the voltage and/or current supported based on the arrangement. As used herein, high-voltage may be in a range of from about 1 kV to about 1.5 kV, from about 1.5 kV to about 1.7 kV, from about 1.7 kV to about 3.3 kV, and/or the like. The voltage associated with an end use application may drive selection of materials and configurations that may differ from the available materials and configurations of other, different end use applications having different voltage ratings. Similarly, the amount of current rating for a particular component may be suitable (and therefore selected as a match) based at least in part on end use parameters.

In one embodiment, the adapter board may be provided as an intermediate element used to drive multiple power modules in parallel such that the trigger signals received at the adapter board are effectively synchronized downstream at each individual power module, and as such, current unbalances and/or delayed switching among the power modules is prevented and/or mitigated. The adapter board may extend over the entire upper surface of the mid-plateau in each of the power modules which are connected in parallel. The mid-plateau may correspond to a sunk cavity at a lower height than the maximum height of the power module on the sides. Conductive traces, such as copper traces, may traverse along the adapter board. The conductive traces may form a tree structure of conductive traces of different widths and/or separations which extend from an input interface of the adapter board conductively coupled to the driver circuit to corresponding power modules. Additionally or alternatively, the adapter board may include additional circuits may protect (e.g., clamping circuits) the input interfaces, terminals conductively coupled to the power modules, and/or the like.

At least one technical effect of various embodiments provides a scalable power of an inverter. At least one technical effect of various embodiments provides synchronously activating and/or deactivating a plurality of the semiconductor switches in parallel. At least one technical effect of various embodiments provides a remote driver circuit to the n-modules in parallel, and to decouple the high voltage aspects and part of the sensing aspects directly close to each module, instead of all together mixed at the driver circuit.

FIG. 1A illustrates a peripheral view of an embodiment of a power system 100. The power system includes a high voltage adapter board 104, a first power module 106, a second power module 107, and a third power module 108. The high voltage adapter board may be fastened and/or conductively (e.g., electrically) coupled and/or connected to the power modules. In connection with FIG. 1B, each of the power modules may include one or more semiconductor switches, such as an upper switch 160 and a lower switch 161 inside each power module. The high voltage adapter board may be a circuit board (e.g., printed circuit board) may synchronously activate the one or more semiconductor switches. The upper switch and the lower switch may be wide-bandgap semiconductors. For example, fabrication of the upper switch and/or the lower switch may include silicon carbide, gallium arsenide, gallium phosphide, indium phosphide, cadmium telluride, aluminum gallium nitride, or gallium nitride.

Figure 1B:
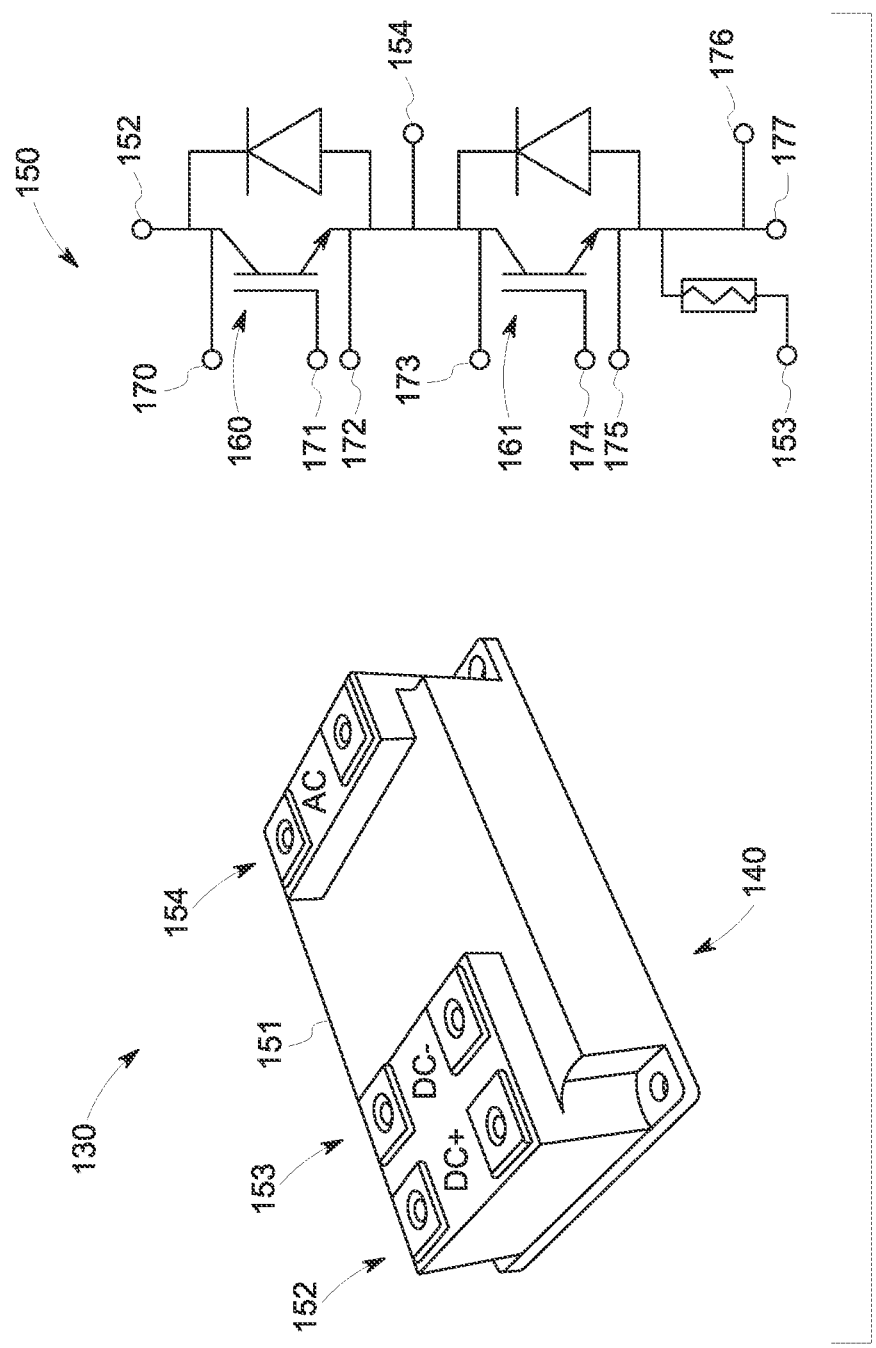
FIG. 1B illustrates an illustration of an embodiment of a module of the power system shown in FIG. 1A.

FIG. 1B illustrates an illustration 130 of an embodiment of the power modules of the power system 100. The schematic illustration includes a peripheral view 140 and a schematic illustration 150 of the first power module. The upper switch and the lower switch are connected in series and are enclosed within a housing 151 of the power modules. The power modules may include a first input terminal 152, a second input terminal 153, and/or a third input terminal 154. In one example, the first, second, and third input terminals may be considered power input terminals. The power modules may include a set of auxiliary terminals 170-177. The auxiliary terminals are conductively coupled to the high voltage adapter board (e.g., terminals 216-221 shown in FIG. 2) and are controlled by a driver circuit. In one example, the driver circuit may be remotely positioned with respect to the high voltage adapter board (e.g. the circuit board).

The upper switch and the lower switch are driven separately from each other. For example, the upper switch may be conductively coupled to conductive traces extending along (e.g., along an upper surface and/or within) the high voltage adapter board, and the lower switch may be conductively coupled to conductive traces extending along (e.g., along a lower surface and/or within) the high voltage adapter board. The power modules may be conductively coupled in parallel with respect to each other. The term "parallel," when used in regard to three-terminal devices, is used to refer to common connections with any two terminals of the three-terminal device. For example, each of the first input terminal, second input terminal, and/or third input terminal of the power modules may be conductively coupled to each other and in parallel, such as the first input terminal of the power modules are conductively coupled together, the second input terminal of the power modules are conductively coupled together, and the third input terminal of the power modules are conductively coupled together.

The one or more semiconductor switches (e.g., the upper switch, the lower switch) may be activated and/or deactivated based on a trigger signal, which may be an electrical signal (e.g., voltage, current) received from the high voltage adapter board shown in FIG. 1A. For example, each of the semiconductor switches are conductively coupled to corresponding first input interface 112 and second input interface 113 of the high voltage adapter board 104 via conductive traces. The first input interface and second input interface may include a connector, a cable, a flexible circuit board, and/or the like. The conductive traces may be a conductive metal (e.g., copper, gold, aluminum, and/or the like) disposed on the upper surface, the lower surface, and/or within the high voltage adapter board from the first input interface and the second input interface to corresponding semiconductor switches (e.g., the upper switch, the lower switch). For example, a first conductive trace may conductively couple the first input interface to the upper switch of the power module. In another example, a second conductive trace along the upper surface may conductively couple the input first input interface to the upper switch of the second power module.

The conductive traces along the upper surface, the lower surface, and/or within the high voltage adapter board may have substantially the same and/or similar properties to each other. The properties may be electrical properties, e.g., inductance, impedance, and resistance. Other properties may include thermal resistance or magnetic properties. Electrical conductivity, for example, may change over a range of temperatures. Accordingly, a first set of traces may have a first resistivity value at a first temperature, and a second set of traces may have the same first resistivity value but at a second temperature that differs from the first temperature. Accordingly, the controller may operate selectively the first or second set of traces at the same property (resistivity) despite a thermal differential.

These properties may be within a determined non-zero threshold (e.g., a percentage, a set value) of each other. Optionally, the determined non-zero threshold may define a set maximum difference between the electrical properties (e.g., inductance, of the conductive traces). For example, the determined non-zero threshold may be five percent such that the electrical properties (e.g., inductances and/or impedances) of the conductive traces are within five percent of each other (e.g., the values are not more than five percent apart from each other). In another example, the determined non-zero threshold may be ten percent, fifteen percent, twenty percent, or the like, such that the values of the electrical properties of the traces are not more than the corresponding ten, fifteen, or twenty percent apart or different from each other Additionally or alternatively, the determined non-zero threshold may represent set values of the electrical properties of the conductive traces. For example, the determined non-zero threshold may be 5 nano-Henries (nH) and 5 milli-Ohms (mOhms), such that the difference in inductance between the conductive traces does not exceed 5 nH and the difference in impedance between the conductive traces does not exceed 5 mOhms. The set values of the determined non-zero thresholds may be different. By forming the different series of conductive traced to have the substantially the same and/or similar electrical properties (e.g., inductance, impedance), and specifically within a determined non-zero threshold (e.g., a percentage, a set value) of each other reduces current imbalance in the terminal. By reducing current imbalance, a more efficient operation may be achieved.

The electrical properties of the conductive traces can affect when the trigger signal at the first input interface and second input interface reach the corresponding upper and/or lower switches of the power modules. For example, conductive traces having substantially the same and/or similar electrical properties (e.g., inductance, impedance) may conduct the trigger signal from the first input interface and second input interface to the corresponding power modules closer together in time (e.g., concurrently and/or simultaneously). Conversely, other traces not having substantially the same or similar electrical properties may not be able to conduct the trigger signals as close together in time because phase shifting is required to address unbalanced current at the terminals. Sending the trigger signals closer together in time can improve operation of the system because the trigger signals are provided as needed, whereas sending the trigger signals farther apart in time can decrease/negatively impact operation system by decreasing efficiencies. The electrical properties of the conductive traces may be adjusted based on a cross-sectional area (e.g., width, height) of the conductive traces such that the difference in electrical properties of the conductive traces remain within a five percent of one another. Additionally or alternatively, the electrical properties of the conductive traces may be adjusted based on a length of the conductive traces.

In some applications the signals are analog signals, and as such the trigger signal must reach a threshold value before recognition. That is, as the energy wave increases, at some determined point the signal is recognized. For insensitive signal receivers, or in electronically or magnetically noisy environments, the signal to noise ratio may need to be greater than in other applications. In some embodiments, the environmental factors (heat, EMP, stray voltage, magnetic interference) may cause the controller to use one set of traces rather than another set of traces.

The trigger signal may be communicated and/or transmitted by the driver circuit conductively coupled to the first input interface and the second input interface. The driver circuit may activate (e.g., ON) and/or deactivate (e.g., OFF) the switches of the power modules based on the generated trigger signals by the driver circuit. For example, the driver circuit may turn on a select set of the switches (e.g., the upper switch, the lower switch) by providing a positive voltage across the gate and emitter terminals of the select set of switches. The driver circuit as shown in FIG. 1A may be disposed and/or positioned remotely with respect to the high voltage adapter board. For example, the driver circuit may be located outside and/or away from the high voltage adapter board having conductive leads 110 may conductively couple the output of the driver circuit to the first and second input interfaces. Optionally, the high voltage adapter board may include a clamping circuit. The conductive leads may introduce a high inductance, which can, under certain circumstances, contribute to a voltage build-up across the gate and emitter terminals of the switches of the power modules. The clamping circuit may mitigate the effect of the high inductance introduced by the conductive leads by preventing the voltage to rise beyond a non-zero determined clamping threshold relative to the trigger signal generated by the driver board. For example, the non-zero determined clamping threshold may be ten percent above and/or below the voltage and/or current of the trigger signal generated by the driver board. Optionally, the clamping circuit may be a part of the power modules. Additionally or alternatively, the driver circuit may be mounted directly and/or indirectly to the high voltage adapter board and/or one or more of the power modules, thereby eliminating the conductive leads. Additionally or alternatively, the driver circuit may be a part of and/or integrated with the high voltage adapter board, such as a single printed circuit board that includes the driver circuit and the high voltage adapter board. To this end, the driver circuit may be mounted on the high voltage adapter board.

Figure 2:
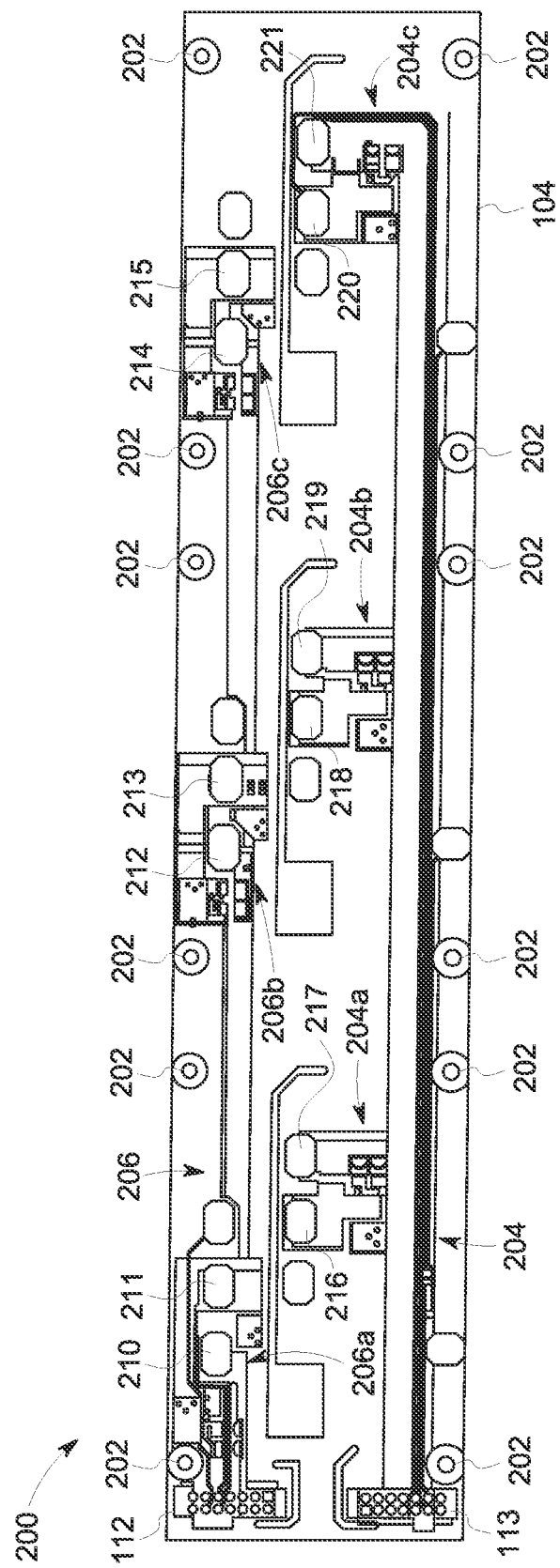
FIG. 2 illustrates a schematic illustration of an embodiment of a circuit board.
Figure 3:
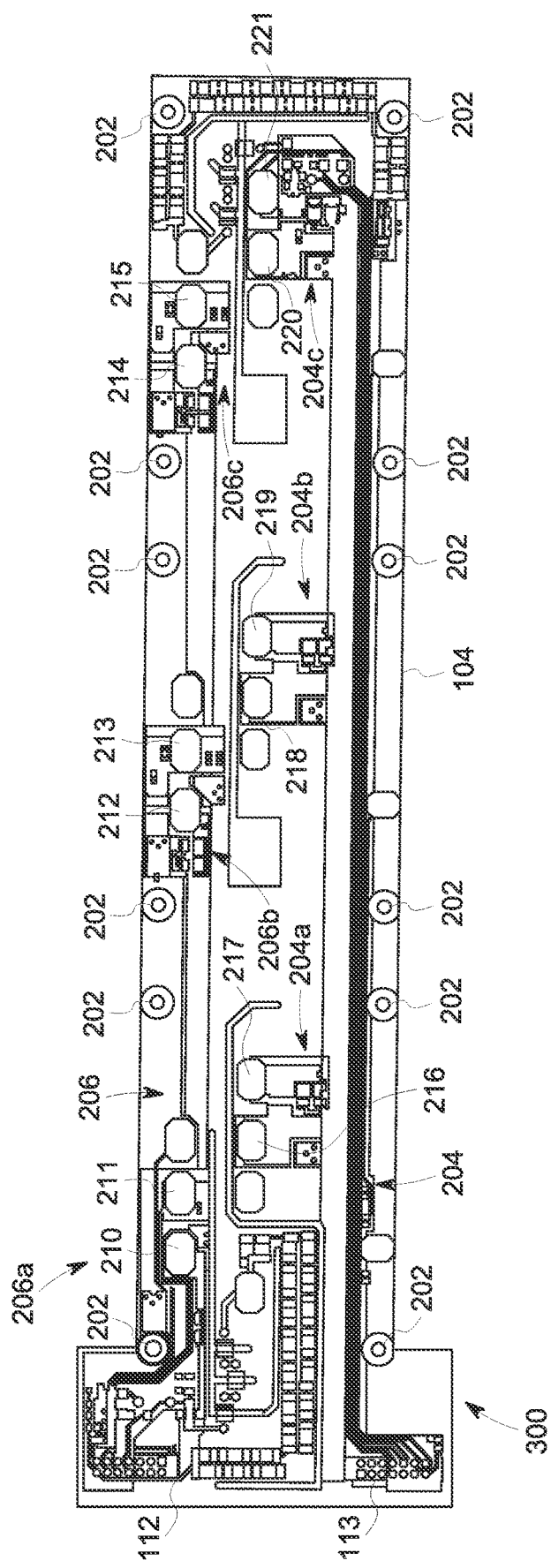
FIG. 3 illustrates a schematic illustration of an embodiment of a circuit board.

FIGS. 2 and 3 illustrate schematic illustrations 200 and 300 of an embodiment of the high voltage adapter board. The high voltage adapter board is shown having a series of openings 202. The openings may mechanically couple the high voltage adapter board to the power modules, using for example, a plurality of screws, fasteners, known mechanical fixation means, and/or the like. For example, fasteners are inserted through each respective opening to facilitate coupling the high voltage adapter board to the power modules.

The high voltage adapter board shown in FIGS. 2 and 3 include a first and second series of conductive traces 204, 206. In one example, the first series may include a pair of conductive traces. Alternatively, the series may include more than two conductive traces or more than two sets of conductive traces. The first series of conductive traces may extend along the lower surface of the high voltage adapter board. The first series of conductive traces may conductively couple the second input interface to terminals of the lower switches of the power modules. For example, the series of conductive traces 204a conductively couples the second input interface to the first terminal 216 and second terminal 217. In one example the first terminal may be a first input terminal and may represent an emitter terminal and the second terminal may represent a gate terminal of the lower switch of the first power module. In another example, the series of conductive traces 204b conductively couples the second input interface 113 to the third terminal 218 and fourth terminal 219. In one example the third terminal may be considered a second input terminal and may represent an emitter terminal, while the fourth terminal may represent a gate terminal of the lower switch of the second power module. In another example, the series of conductive traces 204c conductively couples the second input interface to the fifth terminal 220 and sixth terminal 221. The fifth terminal may be a third input terminal and represent an emitter terminal, and the sixth terminal may represent a gate terminal of the lower switch of the third power module.

The second series of conductive traces may conductively couple the first input interface to terminals 210-215 of the upper switches of the power modules. In one example, the series of conductive traces presents a pair of conductive traces. Alternatively, more than two conductive traces are provided in the series. In one example, a series of conductive traces 206a conductively couples the first input interface to the first terminal 210 and second terminal 211. In one example, the first terminal may represent a gate terminal and the second terminal is considered a first input terminal that may represent an emitter terminal of the upper switch of the first power module. In another example, the series of conductive traces 206b conductively couples the first input interface to the third terminal 212 and fourth terminal 213. The third terminal may represent a gate terminal and the fourth terminal may be considered a second input terminal and may represent an emitter terminal of the upper switch of the second power module. In another example, the series of conductive traces 206c conductively couples the first input interface to the fifth terminal 214 and sixth terminal 215. The fifth terminal may represent a gate terminal and the sixth terminal may be a third input terminal and may represent an emitter terminal of the upper switch of the third power module.

Each of the series of conductive traces may have similar and/or the same electrical properties within the determined non-zero threshold that in one example may within five percent (5%). In other example, the electronical properties such as inductance, impedance, resistance, or the like, between each series of conductive traces may be in a range of from about 5% to about 10%, or may be in a range that is greater than about 10%. The property tolerances may be determined with reference to the end use application, at least in part. In one example, geometric shapes of series of conductive traces may be provided such that the respective electrical properties (e.g., inductance, impedance) of the series of conductive traces are similar to and/or substantially the same with respect to each other within the determined non-zero threshold of 5%. In one example, a first inductance of the first series of conductive traces is within five percent of a second inductance of the second series of conductive traces. In an example, the first series of conductive traces have one or more of different cross-sectional areas, different widths measured along a first direction, different separation distances between the first series of conductive traces measured along a second direction, or different lateral offsets measured along the first direction than the second series of conductive traces, and a first inductance of the first series of conductive traces is within five percent of a second inductance of the second series of conductive traces. Thereby, the trigger signals at the second input interface are received concurrently and/or simultaneously via the series of conductive traces at the terminals 216-221.

Figure 4A:
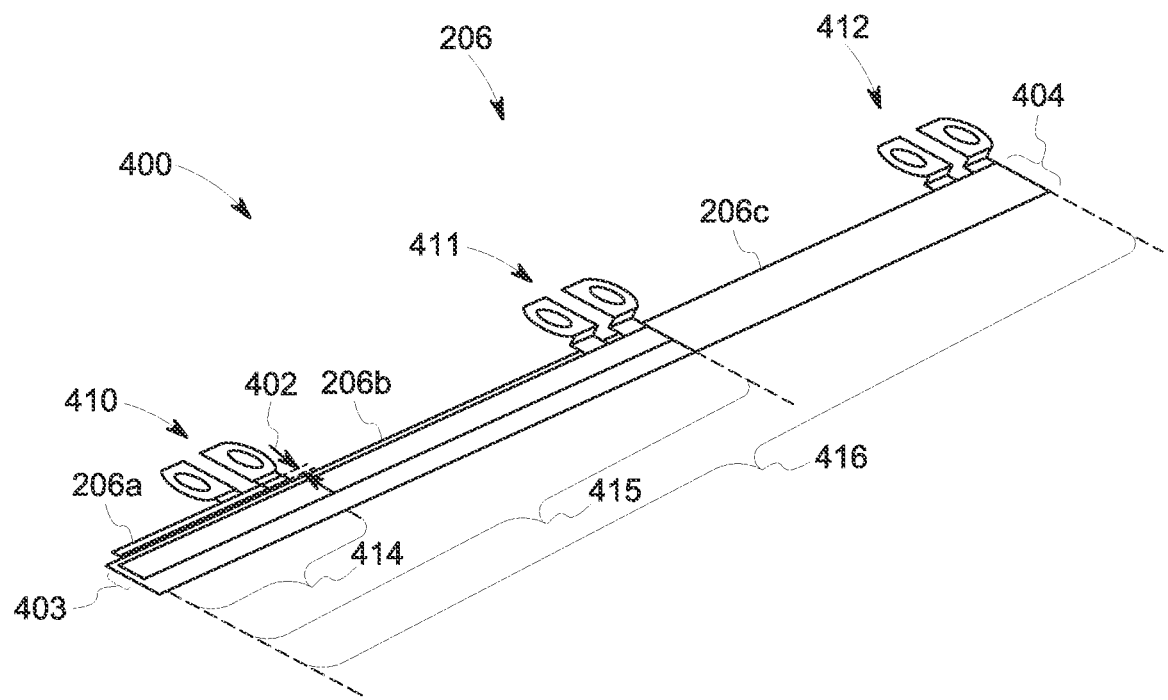
FIG. 4A illustrates a peripheral view of an embodiment of a series of conductive traces.

FIG. 4A illustrates a peripheral view 400 of an embodiment of the series of conductive traces. Each of the series of conductive traces may include a terminal 410-412. The terminals may be conductively coupled to corresponding terminals (e.g., 210-221) of the power modules. The series of conductive traces may have different geometric shapes (e.g., lengths, cross-sectional area, and/or the like) such as different lengths 414-416 and/or cross-sectional areas extending from the first input interface to corresponding terminals. Despite the different geometries, shapes, lengths, etc. of the different conductive traces, each series of conductive traces has electrical properties (e.g., inductance, impedance) that are within five percent of one another. In one example a first inductance of the first series of conductive traces is within five percent of a second inductance of the second series of conductive traces.

For example, the first series of conductive traces has the first length from the input interface to the first and second terminals, the second series of conductive traces has the second length from the first input interface to the third and fourth terminals, and the third series of conductive traces has a third length from the first input interface to the fifth and sixth terminals. Based on the different lengths, a cross-sectional area of the series of conductive traces, shown in FIG. 4B, are composed such that the electrical properties of the series of conductive traces are similar and/or the same with respect to each other within the determined non-zero threshold.

Figure 4B:
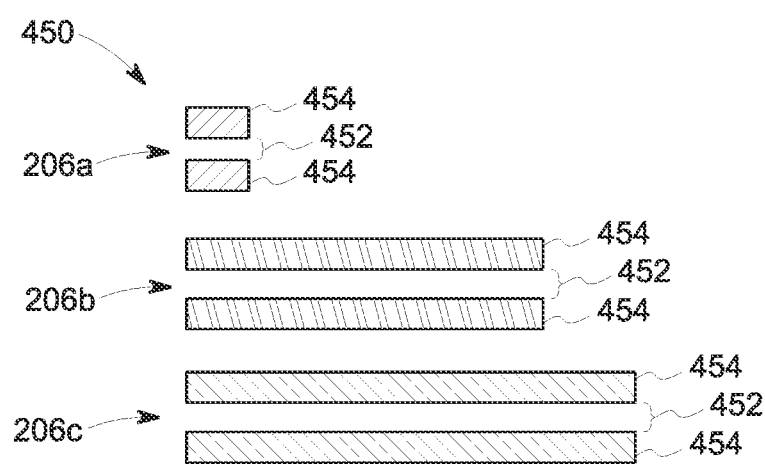
FIG. 4B illustrates a cross-sectional area view of an embodiment of a series of conductive traces.

FIG. 4B illustrates a cross-sectional area view 450 of an embodiment of the series of conductive traces. The series of conductive traces may have different geometric shapes, such as different widths 402-404 to adjust the electrical properties of the conductive traces such that each series of conductive traces has electronical properties within five percent on one another. Each series of conductive traces are separated from each other by a distance 452 and have a height 454. The distance may represent a dielectric separating different layers (e.g., printed circuit board layers) of the high voltage adapter board. Additionally or alternatively, the distance 452 represent a distance separating each conductive trace forming the series of conductive traces. The widths of the series of conductive traces may adjust the electrical properties (e.g., inductance, impedance) of the series of conductive traces from the first input interface to corresponding terminals at each of the power modules, to be similar and/or substantially the same if balancing is required, or to be a determined value in general with respect to each other within the determined non-zero threshold, such as five percent.

Optionally, the cross-sectional areas of the conductive traces may be based on the lengths. For example only, the differences in cross-sectional areas of the series of conductive traces may account for the difference that the lengths have on the electrical properties of the series of conductive traces. In one example, the first series of conductive traces can have the shortest length relative to the lengths and the smallest cross-sectional area relative to the series of conductive traces. For example, the series of first conductive traces may have the width of 1.25 mm and height of 0.035 mm. The second series of conductive traces may have a length that is between the lengths of the first series of conductive traces and third series of conductive traces and has a cross-sectional area that is between the first and third series of conductive traces. For example, the second series of conductive traces may have the width of 5 mm and height of 0.035 mm. The third series of conductive traces may have the largest length relative to the lengths of the conductive traces and has the largest cross-sectional area relative to the first and second series of conductive traces. For example, the third series of conductive traces may have a width of 6 mm and height of 0.035 mm.

Based on the differences in the geometric shapes, such as the cross-sectional areas, of the series of conductive traces, the electrical properties of the series of conductive traces are within five percent with respect to each other. For example, the determined non-zero threshold may be a set value of 1 nH for the inductance and 5.5 mOhms for the impedance, and/or within 5%. The series of conductive traces may have inductances of 11.617 nH, 11.647 nH, and 11.783 nH, respectively. In another example, the series of conductive traces may have resistances of 25.183 mOhms, 23.828 mOhms, and 19.954 mOhms, respectively. The difference in the inductances and the impedances between the series of conductive traces are below the determined non-zero threshold thereby the electrical properties of the series of conductive traces are similar and/or substantially the same.

Additionally or alternatively, the distances, the height, the lengths, the widths, and/or the like, may be adjusted to alter the electrical properties of the series of conductive traces. Optionally, in connection with FIGS. 5A-B, the geometric shape of a series of conductive traces 506 may be the same and/or similar.

Figure 5A:
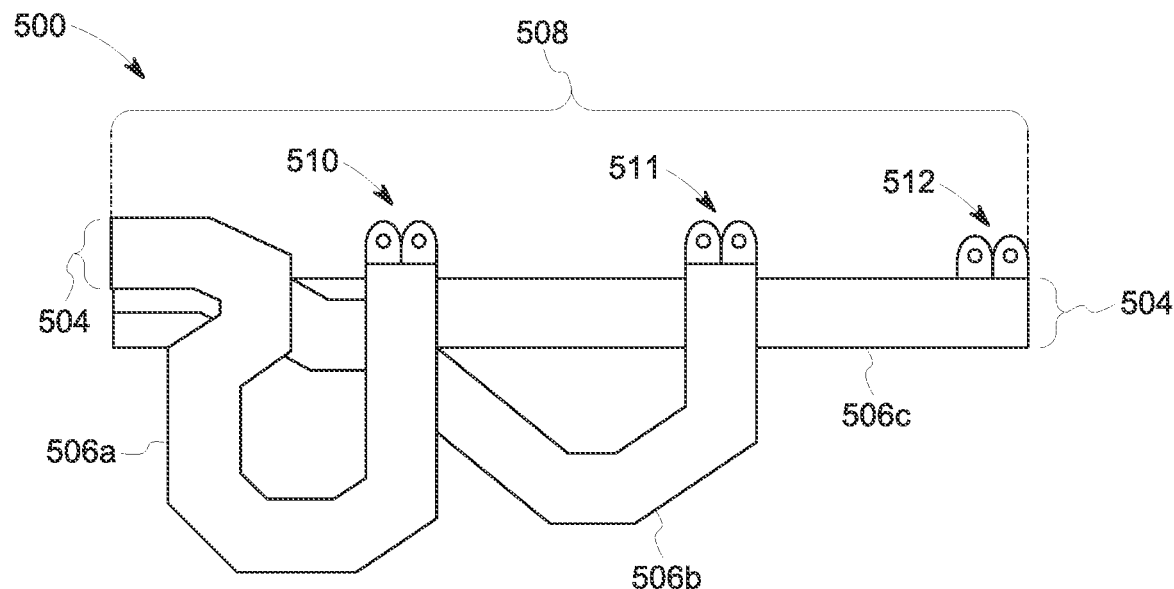
FIG. 5A illustrates a peripheral view of an embodiment of a series of conductive traces.

FIG. 5A illustrates a peripheral view 500 of an embodiment of the series of conductive traces 506. Each series of the first, second, and third conductive traces 506a-c may include first, second, and third terminals 510-512. The first, second, and third terminals of FIG. 5 may be similar to and/or the same as the first, second, and third terminals of FIG. 4. The series of conductive traces have the same length 508 extending from the first input interface. For example, the series of conductive traces may extend along a plurality of non-orthogonal directions to have the length similar to and/or the same as the length of the series of conductive traces. Based on the common length of the series of conductive traces, a cross-sectional area of the series of conductive traces, shown in FIG. 5B, may be established such that the electrical properties of the series of conductive traces are similar and/or the same with respect to each other within the determined non-zero threshold such as five percent.

Figure 5B:
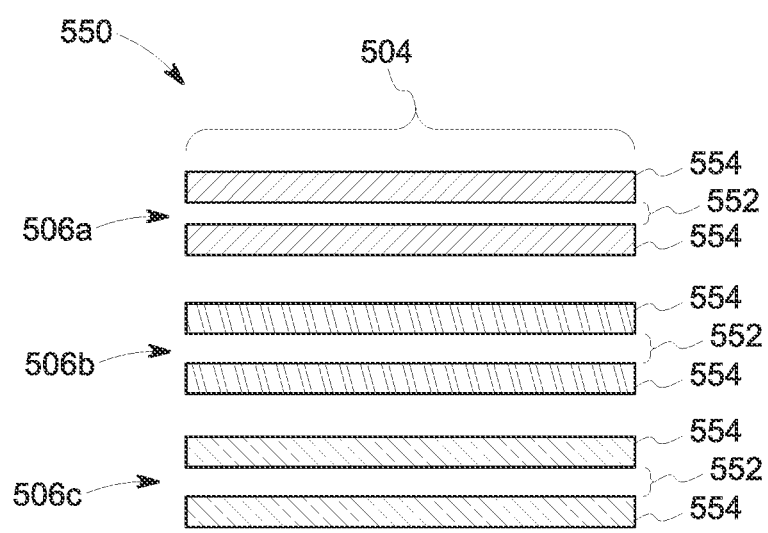
FIG. 5B illustrates a cross-sectional area view of an embodiment of a series of conductive traces.

FIG. 5B illustrates a cross-sectional area view 550 of an embodiment of the series of conductive traces. The series of conductive traces may have the same and/or similar cross-sectional area (e.g. within 5% of one another). For example, based on the common length 508 of the series of conductive traces the cross-sectional area of the series of conductive traces may be the same and/or similar (e.g. within 5% of one another) in order for the electrical properties of the series of conductive traces to be similar and/or the same with respect to each other within the determined non-zero threshold. The series of conductive traces have a common width and height 554 to form the cross-sectional area of the series of conductive traces be the same and/or similar. Each series of conductive traces is separated from each other by a distance 552. The height of FIG. 5B may be similar to and/or the same as the height of FIG. 4B.

Figure 6A:
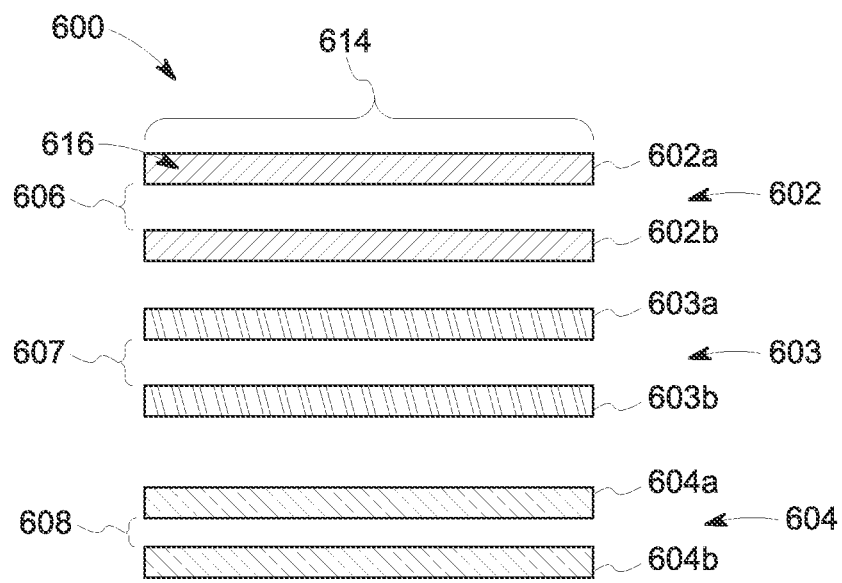
FIG. 6A-B illustrate a cross-sectional area view of embodiments of a series of conductive traces.
Figure 6B:
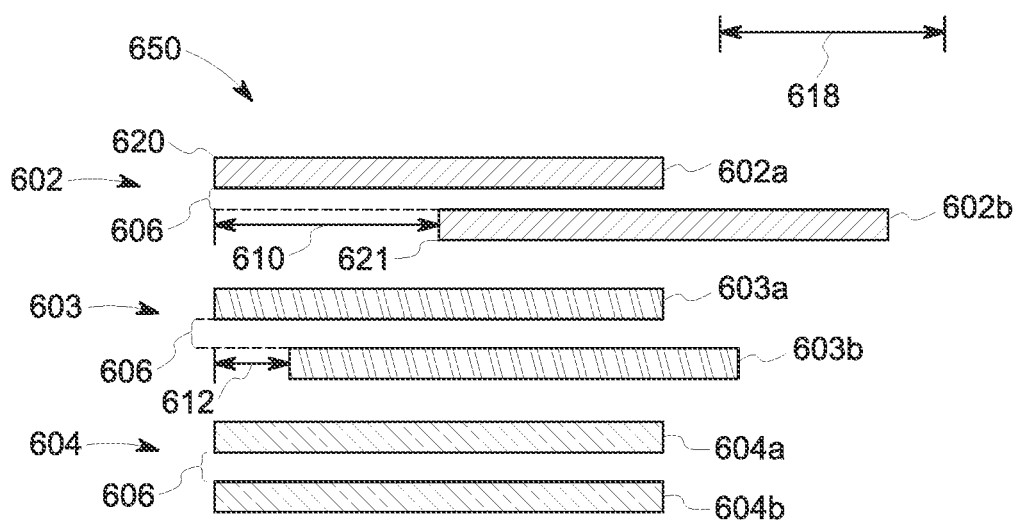

Additionally or alternatively, in connection with FIGS. 6A-B, a spatial relationship between each series of conductive traces 602-604 may be arranged such that the electrical characteristics (e.g., inductance, impedance) of the series of conductive traces are similar and/or substantially the same within the non-zero determined threshold. In one example, the non-zero determined threshold is five percent. In other examples the non-zero determined threshold may be one percent, two percent, ten percent, twenty percent, etc. In particular, the reduction in the difference of the electrical properties between the series of conductive traces reduces unbalance current at terminals while reducing the need to provide phase shifting for the trigger signals, both improving efficiencies and safety of the system.

FIGS. 6A-B illustrate cross-sectional area views 600, 650 of embodiments of a series of conductive traces. The cross-sectional area views each show different spatial relationships between the series of conductive traces.

For example, the cross-sectional area view illustrates three series of conductive traces formed by the conductive traces 602a-604b. The conductive traces each may have a width of 614 and a height of 616. The lengths of the series of conductive traces of FIGS. 6A-6B may be similar to and/or the same as the series of conductive traces of FIG. 2. For example, the first series of conductive traces may have a first length, the second series of conductive traces may have a second length, and the third series of conductive traces may have a third length. The spatial relationship, such as distances 606-608 between the conductive traces forming the series of conductive traces, is arranged such that the electrical characteristics (e.g., inductance, impedance) of each series of conductive traces are similar and/or substantially the same within the non-zero determined threshold such as five percent. For example, the spatial relationship may represent distances between each of the conductive traces forming the series of conductive traces. The distances may represent a composite material, such as a dielectric, separating the conductive traces that form the series of conductive traces. For example, the first conductive traces forming the series of conductive traces is separated by a first distance, the second conductive traces forming the series of conductive traces is separated by the second distance, and the third conductive traces forming the series of conductive traces is separated by the third distance. Each of the first, second, and third distances is different with respect to each other. For example, the first distance may be larger relative to the second and third distances, and the second distance is larger relative to the third distance. The first, second, and third distances may adjust the electrical characteristics of the series of conductive traces between the conductive traces. For example, the first distance between the conductive traces may adjust the electrical characteristics of the series of conductive traces to be similar and/or substantially the same within the non-zero determined threshold such as five percent as the other series of conductive traces. In another example, the distance second between the conductive traces may adjust the electrical characteristics of the series of conductive traces to be similar and/or substantially the same within the non-zero determined threshold such as five percent as the other series of conductive traces.

In another example, the cross-sectional area view 650 illustrates the three series of conductive traces having the same distance between the conductive traces. The cross-sectional area view illustrates lateral offsets 610, 612 of the series of conductive traces. The spatial relationship, such as the lateral offsets, between the conductive traces forming the series of conductive traces are provided such that the electrical characteristics (e.g., inductance, impedance) of each series of conductive traces are similar and/or substantially the same within the non-zero determined threshold such as within five percent. For example, the spatial relationship may represent lateral offsets between each of the conductive traces forming the series of conductive traces. The lateral offsets correspond to a misalignment between the conductive traces forming the series of conductive traces, and the conductive traces forming the series of conductive traces. For example, the lateral offset is formed by a shift along an arrow 618 of a position and/or location of the second conductive trace with respect to the first conductive trace, such that edges 620 and 621 are not aligned. Each of the lateral offsets are different with respect to each other. For example, the first lateral offset is larger relative to the second lateral offset. The lateral offsets may adjust the electrical characteristics of the series of conductive traces to be similar to and/or substantially the same as the electrical characteristics of the series of conductive traces, which has no lateral offset. In an embodiment, a size of the lateral offsets may be based on the different in lengths between the series of conductive traces. For example, the first series of conductive traces have a first length, which is smaller relative to the second and third series of conductive traces having second lengths and third lengths, respectively. Based on the first length, the first lateral offset between the conductive traces may be larger relative to the second lateral offset. Thus, again, varying of geometries, positioning, or the like may be provided to ensure electrical properties such as inductance or impedance of the individual series of conductive traces are within five percent of one another.

Figure 7:
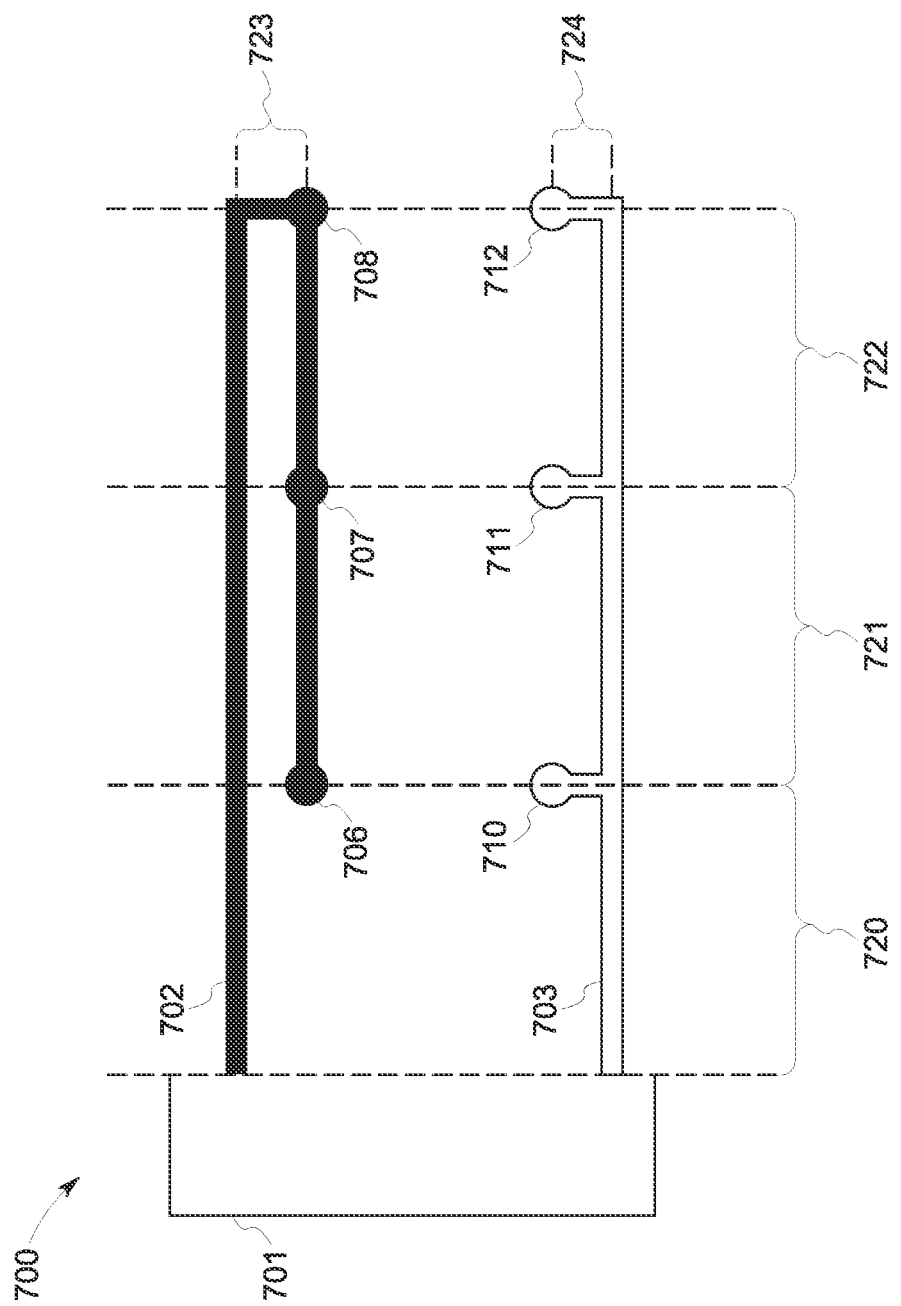
FIG. 7 illustrates a peripheral view of an embodiment of first and second conductive traces.

Additionally or alternatively, in connection with FIG. 7, the high voltage adapter board may utilize first and second conductive traces 702, 703 conductively coupled to first terminals 706-708, or second terminals 710-712 of the power modules of FIG. 1.

FIG. 7 illustrates a peripheral view 700 of an embodiment of the first and second conductive traces, the first conductive trace is conductively coupled to an input interface 701 and the first terminals. The input interface may be similar to and/or the same as one of the first or second input interfaces of FIG. 1. The second conductive trace may be conductively coupled to the input interface and the second terminals. For example, current flows from the input interface to the first terminals via the first conductive trace, and returns to the input interface from the second terminals via the second conductive trace. In this manner the first terminals may be input terminals, while the second terminal may be return terminals. The peripheral view of the first and second conductive paths are shown subdivided into different lengths 720-724. The lengths in one example may be similar and/or substantially the same with each other, such as within 5% of one another. Thus, in one example if the first length to 100 cm, a second length may be 95 cm, while a third length is 98 cm. The first terminals may be conductively coupled to emitter terminals and second terminals may be conductive coupled to gate terminals of the upper or lower switches of the power modules, respectively. For example, a first emitter terminal and first gate terminal may be conductively coupled to a first power module, a second emitter terminal and second gate terminal may be conductively coupled to the second power module, and the third emitter terminal and third gate terminal may be conductively coupled to the third power module. The first and second conductive traces do not overlap. Additionally or alternatively, the first conductive trace and the second conductive trace are not each a series of conductive traces.

Positions of the first terminals, and second terminals with respect to the first and second conductive paths are arranged such that the current paths between the input interface and the power modules are similar and/or substantially the same (e.g. within 5%) for synchronous activation of the switches (e.g., upper or lower switches of the power modules). For example, the current path between the first power module and the input interface may be based on the first emitter terminal and first gate terminal. The current path along the first conductive trace to the first emitter terminal may include a first length, a second length, additional lengths, etc. for a total of 6 segments. The current path along the second conductive trace from the first gate terminal may include a first lengths and a second length or a total of 2 segments. In another example, the current path between the third power module and the input interface are based on a second emitter terminal and a second gate terminal. The current path along the first conductive trace to the second emitter terminal includes the plural lengths or a total of 4 segments. The current path along the second conductive trace from the second gate terminal may include the plural lengths for a total of 4 segments. Thereby, the current paths for both of the first power module and second power module are 8 segments shown in the peripheral view are similar and/or the same.

Figure 8:
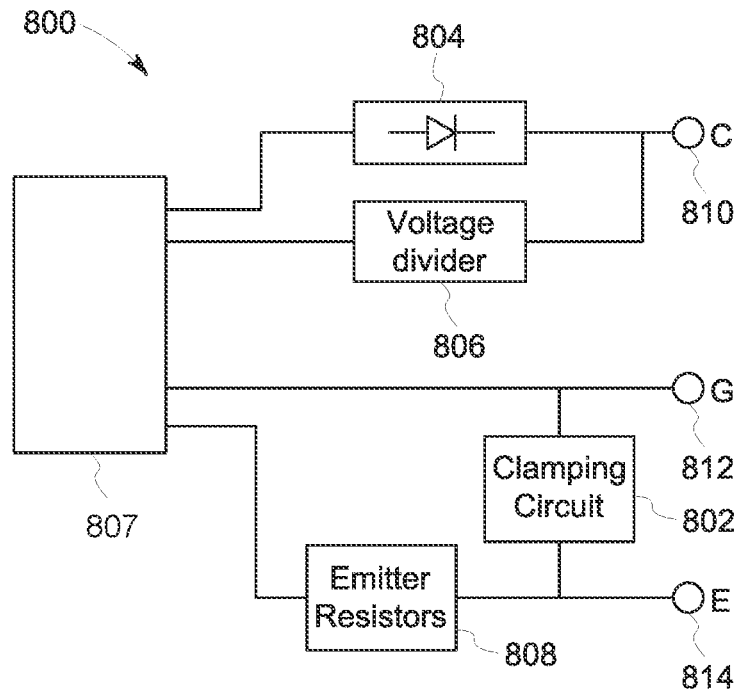
FIG. 8 illustrates a circuit diagram of an embodiment of a portion of the circuit board.

In connection with FIG. 8, the high voltage adapter board may include additional circuitry, such as an isolation circuit 804, clamping circuit 802, and/or the like may insulate the switches of the power modules.

FIG. 8 illustrates a circuit diagram 800 of an embodiment of a portion of the high voltage adapter board. The circuit diagram 800 includes the input interface 807 conductively coupled to the select semiconductor switch (e.g., upper switch or lower switch) via one or more terminals of the one or more power modules. For example, the input interface may be conductively coupled to a gate terminal 812, a collector terminal 810, and an emitter terminal 814. The input interface may be similar to and/or the same as the input interfaces of FIG. 1. For example, the input interface may be conductively coupled to the driver circuit of FIG. 1. Optionally, input interface and the emitter terminal may be conductively coupled to emitter resistors 808 may reduce a current at the emitter terminal. The gate terminal may be conductively coupled to a gate terminal of a select semiconductor switch, and the emitter terminal may be conductively coupled to an emitter terminal of the select semiconductor switch.

The circuit diagram includes the clamping circuit conductively coupled to the gate terminal and the emitter terminal. The clamping circuit may include a diode and/or one or more Zener diodes. The clamping circuit may prevent the voltage across the gate and emitter terminals (e.g., gate-emitter voltage) of the select semiconductor switch from exceeding a voltage limit, above which the select semiconductor switch could be damaged and/or operate erroneously. The voltage limit may be specified by the manufacturer of the select semiconductor switch. For example, depending on the type and design signals of the select semiconductor switch, the voltage limit may be approximately 20 volts. During normal operation, the clamping circuit may not significantly affect the gate-emitter voltage and allows the gate-emitter voltage to reach or exceed the specified turn-on voltage of the select semiconductor switch. The clamping circuit may reduce the gate-emitter voltage across the select semiconductor switch when the gate-emitter voltage exceeds a voltage such as a clamping threshold voltage. Above the clamping threshold voltage, the clamping circuit may be activated, thus preventing an excessive voltage build-up across the select semiconductor switch. The clamping threshold voltage may be between the turn-on voltage of the select semiconductor switch and the voltage limit specified for the select semiconductor switch. Optionally, the clamping threshold voltage may correspond to a breakdown voltage of the clamping circuit based on the diode and/or Zener diodes of the clamping circuit.

The collector terminal may be conductively coupled to a collector terminal of the select semiconductor switch. The circuit diagram also includes a dynamic voltage divider circuit 806 may reduce the voltage at the collector terminal. The dynamic voltage divider circuit may include a series of capacitors. For example, the capacitors are conductively coupled in parallel to a resistor, which is arranged such that a frequency response of a frequency range of interest is flat (e.g., mitigate, reduce, and/or result in no attenuation or peaks).

The circuit diagram includes an isolation circuit conductively coupled to the collector terminal and the input interface. The isolation circuit may isolate the driver circuit and/or the input interface from the voltage at the collector terminal. The isolation circuit may include one or more diodes, a switch (e.g., MOSFET, BJT, semiconductor switch, and/or the like). Additionally or alternatively, the isolation circuit and/or optional circuits of the circuit diagram (e.g., measurement circuit, compensation circuit) may be similar to and/or the same as an operational circuitry as described in U.S. patent application Ser. No. 15/397,588, which is entitled, "SYSTEMS AND METHODS FOR VOLTAGE SENSING."

Figure 9:
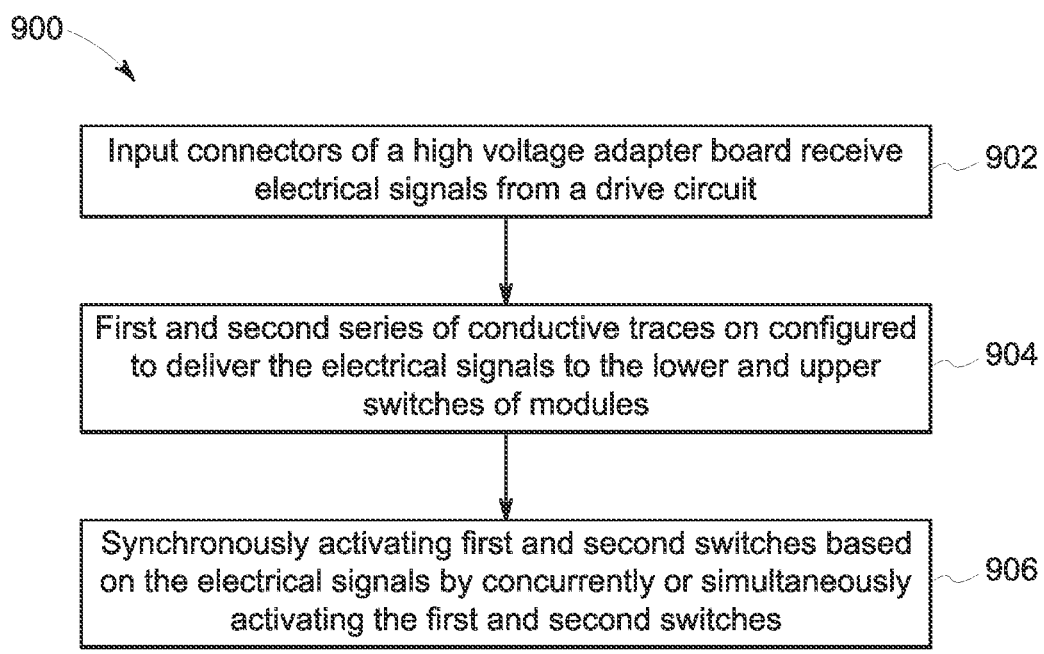
FIG. 9 illustrates a flow chart of a method in accordance with an embodiment.

FIG. 9 is a flow chart of an embodiment of a method 900 for controlling semiconductor switches. The method, for example, may employ or be performed by structures or aspects of various embodiments discussed herein. In various embodiments, certain operations may be omitted or added, certain operations may be combined, certain operations may be performed simultaneously, certain operations may be performed concurrently, certain operations may be split into multiple operations, certain operations may be performed in a different order, or certain operations or series of operations may be re-performed in an iterative fashion. In various embodiments, portions, aspects, and/or variations of the method 900 may be able to be used as one or more algorithms to direct hardware to perform one or more operations described herein.

Beginning at step 902, the input interfaces of the high voltage adapter board receiving a trigger signal from the driver circuit. In one example, the trigger signal may be an electrical signal. For example, the driver circuit may deliver a voltage and/or current along the conductive leads to the input interfaces.

At step 904, the first and second series of conductive traces may deliver the trigger signals to the lower and upper switches, respectively, of the power modules. For example, the first conductive trace of the second series of conductive traces may extend along an upper surface, lower surface, and/or within the high voltage adapter board and is conductively coupled to the input interface and the upper switch, at the terminals of the first power module. In another example, the second conductive trace of the second series of conductive traces may extend along an upper surface, lower surface, and/or within the high voltage adapter board and is conductively coupled to the input interface and the upper switch, at the terminals of the second power module.

At step 906, synchronously activating the first and second switches based on the trigger signal by concurrently and/or simultaneously activating the first and second switches. For example, the conductive traces may have similar and/or the same electrical properties within a determined non-zero threshold, and in particular, within 5% of one another. For example, the cross-sectional areas of the conductive traces are provided such that the electrical properties of the conductive traces are similar to and/or substantially the same with respect to each other within the determined non-zero threshold that in one example may be five percent. As an example, the inductance of a first series of conductive traces is to be within five percent of the inductance of the second series of conductive traces. Thereby, the trigger signals at the input interface are received concurrently and/or simultaneously via the conductive traces at the terminals to synchronously activate the upper switches of the first and second power modules.

In accordance with an example or aspect, a system is provided that includes a circuit board having a first input terminal at a first input interface and a second input terminal at a second input interface. The first input terminal and second input terminal each may receive trigger signals from a driver circuit. The circuit board may include a first series of conductive traces extending along the circuit board and conductively coupled with the first input terminal and a second series of conductive traces extending along the circuit board and conductively coupled with the second input terminal. The system may include a power module that may be coupled with the circuit board, and having an upper switch conductively coupled to the second input terminal by the second series of conductive traces. The power module may have a lower switch conductively coupled to the first input terminal by the first series of conductive traces. In addition, the first series of conductive traces may have one or more of different cross-sectional areas, different widths measured along a first direction, different separation distances between the first series of conductive traces measured along a second direction, or different lateral offsets measured along the first direction than the second series of conductive traces, a first inductance of the first series of conductive traces may be within five percent of a second inductance of the second series of conductive traces.

Optionally, the system may include a driver circuit conductively coupled to the first input interface and the second input interface, and the driver circuit may communicate the trigger signals to the circuit board. In one aspect, the driver circuit may be remotely positioned with respect to the circuit board. In another aspect, the driver circuit may be mounted to the circuit board. In one example, the circuit board may include the driver circuit, and the driver circuit may communicate the trigger signals to the first input interface and the second input interface. In another example, the first series of conductive traces may have a different shape than the second series of conductive traces. In one embodiment, the upper and lower switches in the one or more power modules may be wide-bandgap semiconductor switches that include one or more of silicon carbide, gallium arsenide, gallium phosphide, indium phosphide, cadmium telluride, aluminum gallium nitride, or gallium nitride.

Optionally, the system may include a clamping circuit conductively coupled to the first input terminal or second input terminal of the circuit board. In one aspect, the first series of conductive traces and the second series of conductive traces may extend along different adjacent layers of the circuit board. In another aspect, a spatial relationship between the conductive traces in each of the series may be arranged such that the inductances of each of the series of conductive traces are substantially the same. In one example, the first input interface may include at least one of a connector, a cable, or a flexible circuit board. In another example, the conductive traces in each of the series may extend along paths having a different shape than the conductive traces in the others of the series. In yet another example, the conductive traces in a first series of the series may be disposed in different first and second layers of the circuit board and the conductive traces in a second series of the series may be disposed in different second and third layers of the circuit board. The conductive traces in the first series may have the different lateral offsets than the conductive traces in the second series such that the conductive traces in the first series overlap each other between the first and second layers in the circuit board by a different amount than the conductive traces in the second series. In one embodiment, the first layer, second layer, and third layer may be vertically layered above the circuit board. In another embodiment, the first series of conductive traces may include a first conductive trace section orthogonal to the second series of conductive traces, and the first series of conductive traces may include a second section parallel to the second series of conductive traces. In yet another embodiment, the circuit board may be a printed circuit board.

In accordance with an example or aspect, a method may be provided that may include receiving trigger signals at a first input interface and at a second input interface of a circuit board, and delivering the trigger signals to an upper switch along a first series of conductive traces and a lower switch along a second series of conductive traces of a power module on the circuit board. The first series of conductive traces may have one or more of different cross-sectional areas, different widths measured along a first direction, different separation distances between the conductive traces measured along a second direction, or different lateral offsets measured along the first direction than the second series of conductive traces. The first series of conductive traces may have a first inductance that is within five percent of a second inductance of the second series of conductive traces.

Optionally, the method may include delivering the trigger signals to the first input interface and the second input interface from a driver circuit conductively coupled to the first input interface and second input interface. The driver circuit board may be positioned remotely with respect to the circuit board or may be mounted to the circuit board. In one aspect, the series of conductive traces may extend along different adjacent layers of the circuit board. In another aspect, the upper and lower switches may be fitted with wide-bandgap semiconductors that include silicon carbide or gallium nitride.

In accordance with an example or aspect, a system may be provided that includes a circuit board connected to a plurality of modules each having a first switch conductively coupled to a first input interface of the circuit board through a first series of conductive traces along the circuit board and a second switch conductively coupled to a second input interface of the circuit board through a second series of conductive traces along the circuit board. The system may include a driver circuit that may be conductively coupled to the first input interface and the second input interface of the circuit board. The driver circuit may communicate electrical signals to the first input interface and the second input interface of the circuit board to separately drive each of the first switch and the second switch in the modules. Additionally, the conductive traces in the first series may have one or more of different cross-sectional areas, different widths measured along a first direction, different separation distances between the conductive traces measured along a second direction, or different lateral offsets measured along the first direction than the conductive traces in the second series such that the first series of conductive traces and the second series of conductive traces have inductances within five percent of one another for conduction of the trigger signals to the first and second switches in the modules.

The particular arrangement of components (e.g., the number, types, placement, or the like) of the illustrated embodiments may be modified in various alternate embodiments. For example, in various embodiments, different numbers of a given power module or unit may be employed, a different type or types of a given power module or unit may be employed, a number of power modules or units (or aspects thereof) may be combined, a given power module or unit may be divided into plural power modules (or sub-power modules) or units (or sub-units), one or more aspects of one or more power modules may be shared between power modules, a given power module or unit may be added, or a given power module or unit may be omitted.

As used herein, an element or step recited in the singular and proceeded with the word "a" or "an" do not exclude the plural of said elements or operations, unless such exclusion is explicitly stated. Furthermore, references to "one embodiment" of the invention do not exclude the existence of additional embodiments that incorporate the recited features. Moreover, unless explicitly stated to the contrary, embodiments "comprising," "comprises," "including," "includes," "having," or "has" an element or a plurality of elements having a particular property may include additional such elements not having that property. In the appended claims, the terms "including" and "in which" are used as the plain-English equivalents of the respective terms "comprising" and "wherein." Moreover, in the following clauses, the terms "first," "second," and "third," etc. are used merely as labels, and do not impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function devoid of further structure.

As used herein, the terms "system," "unit," or "module" may include a hardware and/or software system that operates to perform one or more functions. For example, a module, unit, or system may include a computer processor, controller, or other logic-based device that performs operations based on instructions stored on a tangible and non-transitory computer readable storage medium, such as a computer memory. Alternatively, a module, unit, or system may include a hard-wired device that performs operations based on hard-wired logic of the device. The modules or units shown in the attached figures may represent the hardware that operates based on software or hardwired instructions, the software that directs hardware to perform the operations, or a combination thereof. The hardware may include electronic circuits that include and/or are connected to one or more logic-based devices, such as microprocessors, processors, controllers, or the like. These devices may be off-the-shelf devices that are appropriately programmed or instructed to perform operations described herein from the instructions described above. Additionally or alternatively, one or more of these devices may be hard-wired with logic circuits to perform these operations.

Various embodiments may be implemented in hardware, software, or a combination thereof. The various embodiments and/or components, for example, the power modules, or components and controllers therein, may be implemented as part of one or more computers or processors. The computer or processor may include a computing device, an input device, a display unit, and an interface, for example, for accessing the Internet. The computer or processor may include a microprocessor. The microprocessor may be connected to a communication bus. The computer or processor may include a memory. The memory may include Random Access Memory (RAM) and Read Only Memory (ROM). The computer or processor further may include a storage device, which may be a hard disk drive or a removable storage drive such as a solid state drive, optic drive, and the like. The storage device may be other similar means for loading computer programs or other instructions into the computer or processor. As used herein, the term "computer," "controller," and "module" may each include any processor-based or microprocessor-based system including systems using microcontrollers, reduced instruction set computers (RISC), application specific integrated circuits (ASICs), logic circuits, GPUs, FPGAs, and any other circuit or processor capable of executing the functions described herein. The above examples are exemplary only, and are thus not intended to limit in any way the definition and/or meaning of the term "module" or "computer." The computer, module, or processor executes a set of instructions that are stored in one or more storage elements, in order to process input data. The storage elements may store data or other information as desired or needed. The storage element may be in the form of an information source or a physical memory element within a processing machine.

The set of instructions may include various commands that instruct the computer, module, or processor as a processing machine to perform specific operations such as the methods and processes of the various embodiments described and/or illustrated herein. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program. The individual components of the various embodiments may be virtualized and hosted by a cloud type computational environment, for example to allow for dynamic allocation of computational power, without requiring the user concerning the location, configuration, and/or specific hardware of the computer system.

This written description uses examples to disclose several embodiments of the subject matter, including the best mode, and to enable one of ordinary skill in the art to practice the embodiments of subject matter, including making and using any devices or systems and performing any incorporated methods. The patentable scope of the subject matter is defined by the claims, and may include other examples that occur to one of ordinary skill in the art. Such other examples are within the scope of the claims if they have structural elements that do not differ from the literal language of the claims, or if they include equivalent structural elements with insubstantial differences from the literal languages of the claims.

What is claimed is:

1. A system comprising:
a driver circuit configured to output trigger signals;
a circuit board having a first input terminal at a first input interface and a second input terminal at a second input interface, the first input terminal and the second input terminal each connected with the driver circuit to receive the trigger signals from the driver circuit, the circuit board including a first group of conductive traces conductively coupled with the first input terminal and a second group of conductive traces conductively coupled with the second input terminal; and
power modules configured to be coupled with the circuit board, each of the power modules having first and second switches, wherein each of the first switches of each of the power modules is conductively coupled to the first input terminal by one conductive trace of the first group of conductive traces, and wherein each of the second switches of each of the power modules is conductively coupled to the second input terminal by one conductive trace of the second group of conductive traces,
wherein a first conductive trace of the first group of conductive traces and a second conductive trace of the first group of conductive traces are disposed on the circuit board to expose the first conductive trace to a first temperature and to expose the second conductive trace to a second temperature that is different from the first temperature, and wherein the first conductive trace and the second conductive trace are physically configured such that the first conductive trace has a resistance value at the first temperature and the second conductive trace has the resistance value at the second temperature, such that a first switch conductively coupled to the first input terminal via the first conductive trace and a first switch conductively coupled to the first input terminal via the second conductive trace receive trigger signals simultaneously via the first group of conductive traces, and
wherein the trigger signals to activate the first switches of each of the power modules and the trigger signals to activate the second switches of each of the power modules are received in a complimentary manner.

2. The system of claim 1, wherein the driver circuit is remotely positioned with respect to the circuit board.

3. The system of claim 1, wherein the driver circuit selectively communicates the trigger signals based at least in part on environmental factors to which the first group of conductive traces and the second group of conductive traces are exposed.

4. The system of claim 1, wherein the first conductive trace has a different shape than the second conductive trace.

5. The system of claim 1, wherein the first and second switches are wide-bandgap semiconductor switches.

6. The system of claim 1, further comprising a clamping circuit conductively coupled to the first input terminal or the second input terminal of the circuit board.

7. The system of claim 1, wherein the first conductive trace extends along a different layer of the circuit board than the second conductive trace.

8. The system of claim 7, wherein the first conductive trace is spaced apart from the second conductive trace such that the first conductive trace has a first inductance that is within five percent of a second inductance of the second conductive trace.

9. The system of claim 1, wherein the first conductive trace extends along a differently shaped path than the second conductive trace.

10. The system of claim 1, wherein the first conductive trace is disposed in a first layer of the circuit board and the second conductive trace is disposed in a second layer of the circuit board and a third conductive trace of the first group of conductive traces is disposed in a third layer of the circuit board; and the first conductive trace is laterally offset from the second conductive trace such that the first conductive trace overlaps the second conductive trace by a first overlap amount, and wherein the second conductive trace is laterally offset from the third conductive trace such that the second conductive trace overlaps the third conductive trace by a second overlap amount that is different from the first overlap amount.

11. The system of claim 1, wherein the first conductive trace includes a first conductive trace section that is orthogonal to the second conductive trace, and the first conductive trace includes a second conductive trace section that is parallel to the second conductive trace.

12. The system of claim 1, wherein a first conductive trace of the second group of conductive traces and a second conductive trace of the second group of conductive traces are disposed on the circuit board to expose the first conductive trace of the second group of conductive traces to a third temperature and to expose the second conductive trace of the second group of conductive traces to a fourth temperature that is different from the third temperature, and wherein the first conductive trace of the second group of conductive traces and the second conductive trace of the second group of conductive traces are physically configured such that the first conductive trace of the second group of conductive traces has a resistance value at the third temperature and the second conductive trace of the second group of conductive traces has the resistance value at the fourth temperature, such that a second switch conductively coupled to the second input terminal via the first conductive trace of the second group of conductive traces and a second switch conductively coupled to the second input terminal via the second conductive trace of the second group of conductive traces receive trigger signals simultaneously via the second group of conductive traces.

13. A method comprising:
sending trigger signals from a driver circuit to a first input interface and to a second input interface of a circuit board; and
sending the trigger signals to a first switch of a first power module along a first conductive trace of the circuit board, sending the trigger signals to a first switch of a second power module along a second conductive trace of the circuit board, wherein the first conductive trace and the second conductive trace are disposed on the circuit board to expose the first conductive trace to a first temperature and to expose the second conductive trace to a second temperature that is different from the first temperature, and wherein the first conductive trace and the second conductive trace are physically configured such that the first conductive trace has a resistance value at the first temperature and the second conductive trace has the resistance value at the second temperature, such that the first switch of the first power module and the first switch of the second power module receive trigger signals simultaneously via the first conductive trace and the second conductive trace, respectively.

14. The method of claim 13, wherein the first conductive trace and the second conductive trace are physically configured such that the first conductive trace has a first inductance that is within five percent of a second inductance of the second conductive trace.

\* \* \* \* \*